United States Patent
Desbiolles et al.

(10) Patent No.: US 6,841,958 B2
(45) Date of Patent: Jan. 11, 2005

(54) DEVICE FOR CONTROLLING AN ELECTRONICALLY SWITCHED MOTOR COMPRISING ANGULARLY DISTRIBUTED SINGULARITIES

(75) Inventors: Pascal Desbiolles, Thorens-Glieres (FR); Christophe Duret, Annecy (FR)

(73) Assignee: S.N.R. Roulements, Annecy Cedex (FR)

( * ) Notice: Subject to any disclaimer, the term of this patent is extended or adjusted under 35 U.S.C. 154(b) by 0 days.

(21) Appl. No.: 10/670,280

(22) Filed: Sep. 26, 2003

(65) Prior Publication Data

US 2004/0061460 A1 Apr. 1, 2004

(30) Foreign Application Priority Data

Sep. 27, 2002 (FR) .............................. 02 12015

(51) Int. Cl.[7] .............................................. H02K 23/00
(52) U.S. Cl. ...................... 318/254; 318/138; 318/439; 324/207.04; 324/207.2; 340/671
(58) Field of Search ................................. 318/254, 138, 318/439; 324/207.04, 207.2; 340/671

(56) References Cited

U.S. PATENT DOCUMENTS

| | | | | |
|---|---|---|---|---|
| 3,824,587 A | * | 7/1974 | Fowler | 341/10 |
| 4,587,485 A | * | 5/1986 | Papiernik | 324/166 |
| 4,870,559 A | * | 9/1989 | Hyatt | 700/1 |
| 5,431,413 A | | 7/1995 | Hajzler | 277/2 |
| 5,898,301 A | * | 4/1999 | La Croix et al. | 324/207.22 |
| 6,170,162 B1 | * | 1/2001 | Jacobsen et al. | 33/1 PT |
| 6,400,109 B1 | | 6/2002 | Helmut | 318/439 |
| 6,400,143 B1 | * | 6/2002 | Travostino et al. | 324/207.22 |

FOREIGN PATENT DOCUMENTS

| | | |
|---|---|---|
| EP | 0 607 719 B1 | 7/1994 |
| EP | 0 780 964 A2 | 6/1997 |
| FR | 2 769 088 A | 4/1999 |

* cited by examiner

*Primary Examiner*—Rita Leykin
(74) *Attorney, Agent, or Firm*—Arent Fox

(57) ABSTRACT

A device for controlling an electronically switched motor comprising a coder (2) provided with a main multipole track (2a) and a so-called "revolution pip" multipole track (2b), the said tracks each comprising N identical sectors (2c) angularly distributed respectively over the entire circumference of the said tracks, the sectors (2c) of the revolution pip track (2b) each comprising M angularly distributed singularities (2b1), the M singularities (2b1) being distributed angularly so that the revolution pip signal (C) is arranged so as, in combination with the signals A and B, to define binary sequences of angular length less than that of the sectors (2c) and which represent the absolute angular position of the coder (2) on a sector (2c). The invention also relates to a bearing and a motor equipped with such a device, as well as a method for controlling such a motor.

14 Claims, 1 Drawing Sheet

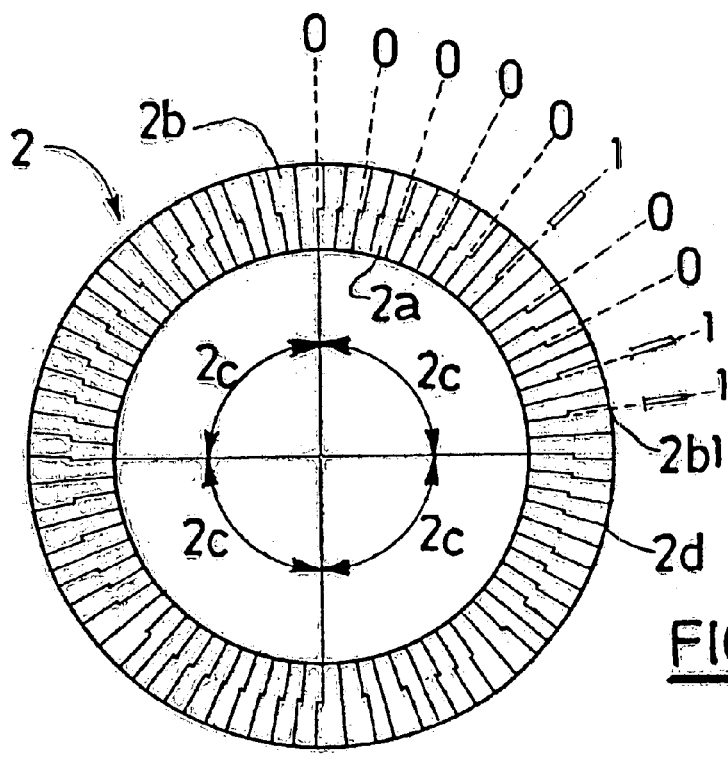
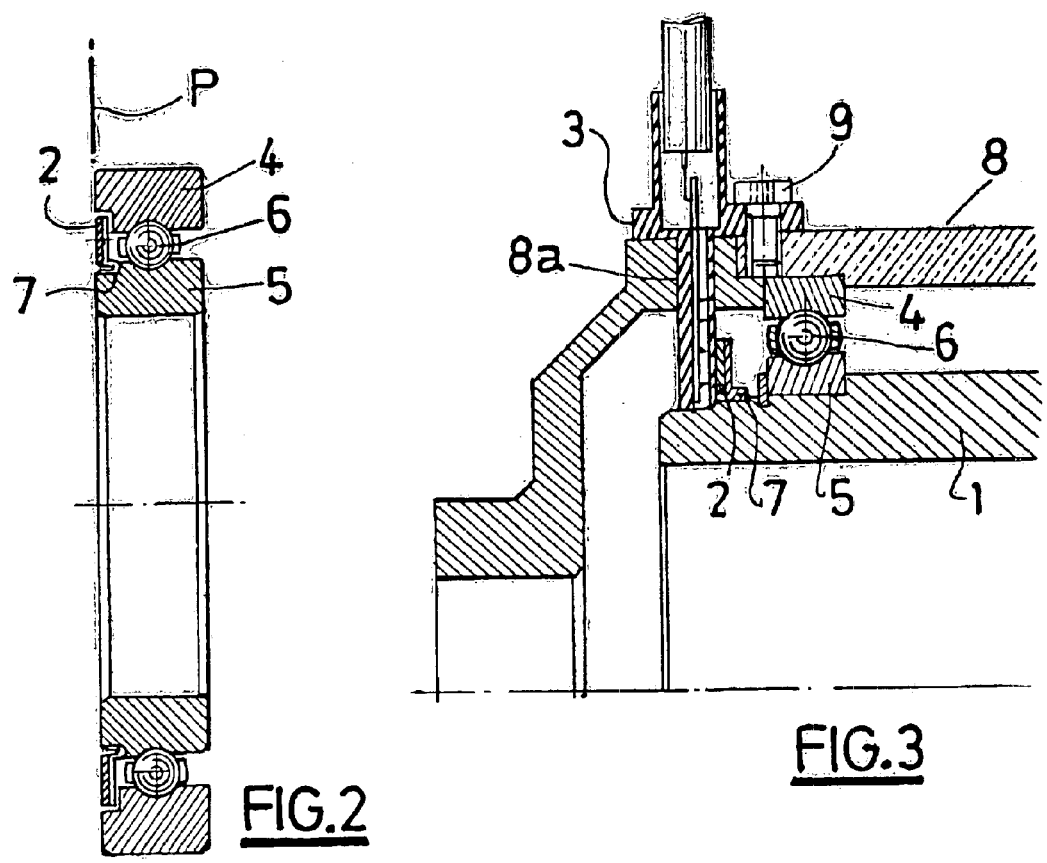
FIG.1
FIG.2
FIG.3

DEVICE FOR CONTROLLING AN ELECTRONICALLY SWITCHED MOTOR COMPRISING ANGULARLY DISTRIBUTED SINGULARITIES

The invention relates to a device for controlling an electric motor of the electronic switching type comprising N pairs of poles and P phases, a bearing and a motor equipped with such a device, as well as a method for controlling such a motor.

Because of their high specific power, electronic switching motors, or brushless motors, can be used for controlling the rotation of a mechanical component in a large number of applications.

In particular one example of such an application is steering assistance for motor vehicles by means of an assisted steering system of the electrical type.

In the context of this application, it is necessary to precisely control the switching of the current in the phases of these motors in order to obtain a torque which is optimal.

It is known how to use a control device comprising a sensor provided with P sensitive elements disposed opposite a coder comprising N pairs of poles, the said coder being rotated by the motor.

In the case of a three-phase DC brushless motor, by making provision for the three sensitive elements to be out of phase with respect to each other by a mechanical angle making it possible to supply three electrical switching signals which are out of phase by 120° electrical, it is possible to control the switching between the phases of the motor.

However, this type of solution affords only limited precision in the determination of the switching times of the current in the phases.

This is because, in the known control devices, the precision of the switching signals is a function of the tolerances in production and magnetisation of the magnetic coders and positioning of the sensitive elements on their support, these two factors being able to be obtained only with non-zero tolerances.

Consequently, because of these tolerances, the precision of the phase difference between the switching signals is not exactly 120° electrical, which causes undesirable modulations of the torque supplied by the motor.

To resolve this problem, control devices have been proposed comprising a second sensor of the "resolver" type which makes it possible to know the absolute position of the rotor in order to improve the precision in control of the motor.

However, this type of solution is not satisfactory in that it gives rise to mechanical integration constraints because of the size of the sensors of the "resolver" type. In addition there is added the difficulty in conveying the analogue signals issuing from the resolver to a demodulator calculating the absolute position of the rotor.

In order in particular to overcome this drawback, the invention proposes a control device which uses a signal for the absolute position of the rotor in order to control the switching of the currents in the phase windings of the motor, the said absolute position being obtained with a single sensor/coder assembly. In addition, when it is brought into service, the control device according to the invention makes it possible to obtain the absolute angular position of the rotor provided that the rotor has turned by an angle less than the angular width of the pairs of poles of the motor.

To this end, and according to a first aspect, the invention proposes a device for controlling an electric motor of the electronic switching type comprising N pairs of poles and P phases, the said device comprising:

a coder intended to be rotated conjointly with the rotor of the motor, the said coder comprising a main multipole track and a so-called "revolution pip" multipole track which are concentric, the said tracks each comprising N identical sectors angularly distributed respectively over the entire circumference of the said tracks, the sectors of the revolution pip track each comprising M angularly distributed singularities;

a fixed sensor disposed opposite to and at an air-gap distance from the coder, comprising at least three sensitive elements, at least two of which are positioned opposite the main track so as to deliver two periodic electrical signals S1, S2 in quadrature and at least one of which is positioned opposite the revolution pip track so as to deliver an electrical signal S3, the sensor comprising an electronic circuit able, from the signals S1, S2 and S3, to deliver two square digital position signals A, B in quadrature which represent the angular position of the rotor and a revolution pip signal C in the form of N*M pulses per revolution of the coder, the M singularities being angularly distributed so that the revolution pip signal C is arranged so as, in combination with the signals A and B, to define the binary sequences of angular length less than that of a sector and which represent the absolute angular position of the coder on a sector;

a circuit for switching the currents in the phase windings of the motor which comprises 2*P*N switches;

a circuit for controlling the switching circuit which is able:

when a binary sequence of the revolution pip signal C is read, to determine the state of the switching logic of the currents in the phase windings which corresponds to the absolute angular position associated with the said binary sequence;

according to the position signals A, B detected, to determine continuously the state of the switching logic which is adapted to the angular position of the rotor;

to supply the switching signals for the switches which correspond to the state of the logic determined by the revolution pip signal C or by the position signals A, B.

According to a second aspect, the invention proposes a bearing of the type comprising a fixed race intended to be associated with a fixed member, a rotating race intended to be rotated by the rotor of the electric motor and rolling bodies disposed between the said races, in which the coder of such a control device is associated with the rotating race.

According to a third aspect, the invention proposes an electronically switched motor equipped with such a control device, of the type comprising a motor mounted for rotation by means of such a bearing, in which the sensor is associated with the fixed race.

In a variant, the sensor of the control device is associated with a fixed piece of the motor.

According to another embodiment, the coder of the control device is associated with the rotor of the motor.

According to a fourth aspect, the invention proposes a method for controlling such a motor which comprises the following successive steps:

application of a torque to the rotor so as to allow its rotation and therefore that of the coder;

detection of the first binary sequence;

determination of the state of the switching logic corresponding to the absolute angular position associated with the said binary sequence;

sending to the switching circuit switching signals corresponding to the state determined;

iterative determination of the subsequent states of the switching logic from the position signals A, B;

sending to the switching circuit the switching signals corresponding to the states determined.

Other objects and advantages of the invention will emerge during the following description, given with reference to the accompanying drawings, in which:

FIG. 1 is a front view of a coder comprising a main multipole track and a revolution pip multipole track;

FIG. 2 is a view in longitudinal section of a bearing provided with a coder such as the one depicted in FIG. 1;

FIG. 3 is a partial view in longitudinal section of a motor according to the invention.

The invention relates to a device for controlling an electronically switched motor or brushless motor comprising N pairs of poles and P phases.

This type of motor comprises typically a rotor 1 carrying N pairs of North/South magnetic poles and a stator carrying P coils formed respectively by a phase winding, the rotor 1 being rotated in a known fashion by controlling the electrical supply in the P phase windings.

The control device comprises a coder 2, such as the one depicted in FIG. 1, which comprises a main multipole track 2a and a so-called "revolution pip" multipole track 2b which are concentric. The tracks comprise N identical sectors 2c angularly distributed respectively over the entire circumference of the said tracks, the sectors of the revolution pip track 2b each comprising M angularly distributed singularities 2b1. The coder 2 is intended to effect, conjointly with the rotor 1, a plurality of revolutions about its axis of rotation.

In a particular example, the coder 2 is formed by a multipole magnetic ring on which there are magnetised a plurality of pairs of North and South poles 2d equally distributed with a constant angular width so as to form the main 2a and revolution pip 2b tracks, a magnetic singularity 2b1 of the revolution pip track 2b being formed by two adjacent poles whose magnetic transition is different from the others.

According to the embodiment depicted in FIG. 1 (P=3, N=4), the main track 2a, disposed towards the inside of the ring 2, and the revolution pip track 2b, disposed towards the outside of the ring 2, comprise forty pairs of poles 2d which are distributed in four sectors 2c of ten pairs of poles each. The pairs of poles 2d of the revolution pip track 2b are offset in phase by a value $\phi$ with respect to those of the main track 2a.

Each sector 2c of the revolution pip track 2b comprises 3 magnetic singularities 2b1 which are angularly distributed with different distances between them. Each singularity 2b1 is formed by a pair of poles 2d, the width of the poles being arranged so that a pole is out of phase by $-\phi$ with respect to the corresponding pole of the main track 2a. Thus any pulse of the signal C corresponds to the detection of a reversal of phase difference between the main track 2a and the revolution pip track 2b.

The control device also comprises a fixed sensor 3 disposed opposite to and at an air-gap distance from the coder 2.

The sensor 3 comprises at least three sensitive elements, at least two of which are positioned opposite the main track 2a and at least one of which is positioned opposite the revolution pip track 2b.

In a particular example, the sensitive elements are chosen from the group comprising Hall effect sensors, magnetoresistors and giant magnetoresistors.

The sensor 3 used is able to deliver two periodic electrical signals S1, S2 in quadrature by means of the sensitive elements disposed opposite the main track 2a and an electrical signal S3 by means of the sensitive elements disposed opposite the revolution pip track 2b.

The principle of obtaining the signals S1 and S2 from a plurality of aligned sensitive elements is for example described in the document FR-2 792 403 issuing from the applicant.

However, sensors 3 comprising two sensitive elements which are able to deliver the signals S1 and S2 are also known.

The sensor 3 also comprises an electronic circuit which, from the signals S1, S2 and S3, delivers square position digital signals A, B in quadrature and a revolution pip signal C in the form of M*N electrical pulses per revolution of the coder 2.

A principle of obtaining the digital signals A, B and C and various embodiments of the magnetic singularities 2b1 are described in the documents FR-2 769 088 and EP-0 871 014.

According to one embodiment, the sensor 3 also comprises an interpolator, for example of the type described in the document FR-2 754 063 issuing from the applicant, for increasing the resolution of the output signals.

The sensor 3 can be integrated on a silicon substrate or equivalent, for example AsGa, so as to form an integrated circuit personalised for a specific application, a circuit sometimes designated by the term ASIC in order to make reference to the integrated circuit designed partially or completely according to requirements.

Although the description is given in relation to a coder/magnetic sensor assembly, it is also possible to implement the invention in a similar manner using a technology of the optical type. For example, the coder 2 can be formed by a target made from metal or glass on which the main 2a and revolution pip 2b tracks have been etched so as to form an optical pattern similar to the multipole magnetic pattern disclosed above, the sensitive elements then being formed by optical detectors.

In the embodiment depicted in FIG. 1, the angular distribution of the three singularities of the revolution pip track 2b can be represented by the binary pattern 0000010011 obtained by use of the signal C and the signals A and B during a rotation along a sector 2c, where the digit 1 corresponds to the detection of a singularity on the signal C and the digit 0 to the opposite occurrence, the digits 0 and 1 being allocated respectively to the pairs of poles which are discriminated by means of the signals A and B.

With this binary pattern, it is possible to establish, according to the initial position of the coder 2 and the direction of rotation, the number of states 0 or 1 to be read in order to determine unequivocally the absolute position of the coder 2 on a sector 2c. In the remainder of the description, this succession of 0s or 1s which makes it possible to determine an absolute position of the coder 2 on a sector 2c is called a binary sequence.

For example, starting from the position of the first 0 of the binary pattern, in order to unequivocally know the absolute position of the coder 2 on a sector 2c, it is necessary:

turning to the right, to read the binary sequence 00001;

turning towards the left, to read the binary sequence 110;

turning alternatively to the left and towards the right, to read the binary sequence 11000.

By performing this analysis for all the possible initial positions, the maximum length of the binary sequence and therefore the maximum rotation to be made in order to know the absolute position of the coder 2 on a sector 2c are determined. In the example in FIG. 1, in the worst of cases, a rotation of 5 pairs of poles of the coder is necessary, that is to say 45° mechanical, in order to unequivocally know the absolute position of the coder 2 on a sector 2c.

According to the invention, it is therefore possible, if the angular length of the binary sequence is less than that of the sector 2c, to know the absolute position of the coder 2 and therefore that of the associated rotor 1, as soon as the latter has turned through an angle less than the angular width of the pairs of poles of the motor.

According to the specific requirements of each application, it is possible to distribute the singularities differently on the revolution pip track 2b so as either to increase or to decrease the maximum length of the binary sequences. In addition, it is also possible to vary the number of pairs of poles of the coder per sector 2c and therefore to obtain a longer or shorter binary pattern, and/or to vary the dimensions of the coder 2.

The control device also comprises a circuit for switching the currents in the phase windings of the motor.

The switching circuit comprises 2*P*N switches, for example each formed by a field effect transistor of the MOSFET type functioning at 20 kHz, which are disposed in a bridge so as to supply the phase windings in an appropriate manner.

The 2*P*N switches can be actuated in pairs according to a switching logic comprising 2*P*N possible states.

The control of the switching device, that is to say the selective actuation of the switches, is performed by a control circuit which is able:

- when a binary sequence is read, to determine the state of the switching logic of the currents in the phase windings which corresponds to the absolute angular position associated with the said binary sequence;
- according to the position signals A, B detected, to determine continuously the state of the switching logic which is adapted to the angular position of the rotor 1;
- to supply the switching signals of the switches which correspond to the state of the logic determined by the revolution pip signal C or by the position signals A, B.

The control circuit can be produced in the form of a microprocessor integrating at least one switching logic of the switching circuit which determines the succession of the openings/closings of the various switches.

The functioning of the control device is described below.

Initially, that is to say when the device is brought into service, a torque is applied to the rotor 1 so as to enable it and therefore the coder 2 to be set in rotation.

In particular, in the case of the use of the control device in electrically assisted steering for a motor vehicle, the torque can be applied by means of the steering wheel without an assistance torque being supplied.

This is because, in this application and with the coder depicted in FIG. 1, the angle of deflection without assistance will be a maximum of 3 degrees assuming that the electrically assisted steering has a reduction ratio of 15, which is entirely acceptable.

In a variant, the motor can be initially supplied with current by a pre-established control sequence, so as to enable the rotor 1 and therefore the coder 2 to be set in rotation.

As soon as the first binary sequence is detected, the control circuit determines the state of the switching logic of the currents in the phase windings which corresponds to the angular position associated with the said binary sequence and sends the corresponding switching signals to the switching circuit.

Next, the position signals A, B make it possible to know the absolute position of the rotor 1, that is to say the position with respect to the one associated with the said binary sequence detected so as to continuously determine the state of the switching logic which is adapted. This is because, to each position of the rotor 1, there corresponds a state of the switching logic which makes it possible to obtain an optimum motor torque. The control circuit can therefore supply, to the switching circuit, the switching signals for the switches which correspond to the state of the logic determined.

In a variant, it is possible to provide a prior step of angular indexing of the revolution pip pulses with respect to the zeroing of the electromotive forces in the phases of the motor, that is to say the indexing of the angular positions of the singularities 2b1 with respect to those of the pairs of poles of the motor. This step can be performed on leaving the production line and on a dedicated bench, the value of the phase differences being able to be stored in a memory of the EEPROM or flash type of the control circuit so as to allow the readjustment of the switching times electronically. This storage makes it possible to dispense with mechanical indexing of the coder, which proves to be difficult and expensive.

According to the invention, the precision in the determination of the switching times is therefore limited only by the precision of the measurement of the angular position of the rotor 1.

In addition, as soon as the coder 2 has turned through an angle which can be modulated according to the distribution of the singularities 2b1, the motor can be controlled in an optimum fashion.

In relation to FIG. 2, a bearing is described comprising a fixed outer race 4 intended to be associated with a fixed member, a rotating inner race 5 intended to be rotated by the rotor 1 of the electric motor and rolling bodies 6 disposed between the said races.

In the embodiment depicted, the coder 2 is moulded onto an annular cylindrical surface of an armature 7 which is associated, for example by shrinking on, on a face of the inner race 5.

The coder 2 is associated with the rotating race 5 so that the external face of the coder is substantially contained in the plane P of a lateral face of the fixed race 4. This characteristic, in particular disclosed in the document EP-0 607 719 issuing from the applicant, makes it possible on the one hand to protect the coder 2 inside the bearing and on the other hand to be able to dissociate the sensor 3 from the bearing whilst keeping control of the air gap.

In relation to FIG. 3, an electronically switched motor is described comprising a rotor 1 mounted for rotation by means of a bearing. For this purpose, the outer race 4 of the bearing is associated with the casing 8 of the motor and the inner race 5 is associated, for example by shrinking on, with the rotor 1 of the said motor. The sensor 3 is disposed in a slot 8a in the casing 8 and is associated with the said casing by means of a screw 9. In a variant, provision can be made for the sensor 3 to be associated with the outer race 4 of the bearing.

In addition, the coder 2 is associated with the rotor 1. For this purpose, the armature 7 is for example shrunk onto a surface provided on the periphery of the rotor 1.

What is claimed is:

1. A device for controlling an electric motor of the electronic switching type comprising N pairs of poles and P phases, the said device comprising:

a coder (2) intended to be rotated conjointly with the rotor (1) of the motor, the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses per revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches;

a circuit for controlling the switching circuit which is able:

when a binary sequence is read, to determine the state of the switching logic of the currents in the phase windings which corresponds to the absolute angular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B).

2. A device according to claim 1, characterised in that the angular distances separating each of the M singularities (2b1) are different from each other.

3. A device according to claim 1, characterised in that each multipole track (2a, 2b) is formed by a magnetic ring on which there are magnetised North and South poles (2d) equally distributed with a constant angular width, a magnetic singularity (2b1) of the revolution pip track (2b) being formed by two adjacent poles (2d) whose magnetic transition is different from the others.

4. A bearing of the type comprising a fixed race (4) intended to be associated with a fixed member, a rotating race (5) intended to be rotated by the rotor (1) of the electric motor and rolling bodies (6) disposed between the said races, the said bearing being characterised in that the coder (2) of a control device according to claim 1 is associated with the rotating race (5).

5. A bearing according to claim 4, characterised in that the coder (2) is associated with the rotating race (5) so that the external face of the said coder is substantially contained in the plane P of a lateral face of the fixed race (4).

6. A bearing according to claim 5, characterised in that the coder (2) is carried by an association armature (7).

7. A bearing according to any one of claims 4 to 6, characterised in that the sensor (3) of the control device is associated with the fixed race (4) of the bearing.

8. An electronically switched motor equipped with a control device said motor including N pairs of poles and P phases, said device for controlling the motor comprising:

a coder (2) intended to be rotated conjointly with the rotor (1) of the motor the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses per revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches;

a circuit for controlling the switching circuit which is able;

when a binary sequence is read, to determine the state of the switching logic of the currents in the phase windings which corresponds to the absolute angular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B), said motor further comprising a rotor (1) mounted for rotation by means of a bearing according to claim 7.

9. An electronically switched motor equipped with a control device said motor including N pairs of poles and P phases, said device for controlling the motor comprising:

a coder (2) intended to be rotated conjointly with the rotor (1) of the motor, the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses near revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches:

a circuit for controlling the switching circuit which is able;

when a binary sequence is read, to determine the state of the switching logic of the currents in the chase windings which corresponds to the absolute annular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B), said motor further comprising a rotor (1) mounted for rotation by means of a bearing according to any one of claims 4 to 6, the sensor (3) being associated with a fixed piece (8) of the motor.

10. An electronically switched motor equipped with a control device said motor including N pairs of poles and P phases, said device for controlling the motor comprising:

a coder (2) intended to be rotated conjointly with the rotor (1) of the motor, the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses per revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches;

a circuit for controlling the switching circuit which is able;

when a binary sequence is read, to determine the state of the switching logic of the currents in the phase windings which corresponds to the absolute angular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B), said motor further comprising a rotor (1) and a fixed piece (8), in which the coder (2) is associated with the rotor (1) and the sensor (3) is associated with the fixed piece (8).

11. A method for controlling a motor said motor being an electronically switched motor equipped with a control device, said motor including N pairs of poles and P phases, said device for controlling the motor comprising;

a coder (2) intended to be rotated conjointly with the rotor (1) of the motor, the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses per revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches;

a circuit for controlling the switching circuit which is able;

when a binary sequence is read, to determine the state of the switching logic of the currents in the phase windings which corresponds to the absolute angular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B), said motor further comprising a rotor (1) mounted for rotation by means of a bearing comprising a fixed race (4) intended to be associated with a fixed member, a rotating race (5) intended to be rotated by the rotor (1) of the electric motor and rolling bodies (6) disposed between the said races, wherein the coder (2) is associated with the rotating race (5) and is carried by an association armature (7), and the sensor (3) is associated with the fixed race (4) of the bearing; said method comprising the following successive steps:

applying a torque to the rotor (1) 50 as to allow its rotation and therefore that of the coder (2);

detecting the first binary sequence;

determining the state of the switching logic corresponding to the absolute angular position associated with the said binary sequence;

sending to the switching circuit switching signals corresponding to the state determined;

iteratively determining of the subsequent states of the switching logic from the position signals (A, B);

sending to the switching circuit the switching signals corresponding to the states determined.

12. A method for controlling a motor, said motor being, an electronically switched motor equipped with a control device, said motor including N pairs of poles and P phases, said device for controlling the motor comprising:

a coder (2) intended to be rotated conjointly with the rotor (1) of the motor, the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses per revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches;

a circuit for controlling the switching circuit which is able:

when a binary sequence is read, to determine the state of the switching logic of the currents in the phase windings which corresponds to the absolute angular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B), said motor further comprising a rotor (1) mounted for rotation by means of a bearing comprising a fixed race (4) intended to be associated with a fixed member, a rotating race (5) intended to be rotated by the rotor (1) of the electric motor and rolling bodies (6) disposed between the said races, wherein the coder (2) is associated with the rotating race (5) so that the external face of the docer is substantially contained in the plane P of a lateral face of the fixed race (4), and the sensor (3) being associated with a fixed piece (8) of the motor: said method comprising the following successive steps:

applying a torque to the rotor (1) so as to allow its rotation and therefore that of the coder (2);

detecting the first binary sequence;

determining the state of the switching logic corresponding to the absolute angular position associated with the said binary sequence;

sending to the switching circuit switching signals corresponding to the state determined;

iteratively determining of the subsequent states of the switching logic from the position signals (A, B);

sending to the switching circuit the switching signals corresponding to the states determined.

13. A method for controlling a motor, said motor being, an electronically switched motor equipped with a control device, said motor including N pairs of poles and P phases, said device for controlling the motor comprising:

a coder (2) intended to be rotated conjointly with the rotor (1) of the motor, the said coder comprising a main multipole track (2a) and a revolution pip multipole track (2b) which are concentric, the said tracks each comprising N identical sectors (2c) angularly distributed respectively over the entire circumference of the said tracks, the sectors (2c) of the revolution pip track (2b) each comprising M angularly distributed singularities (2b1);

a fixed sensor (3) disposed opposite to and at an air-gap distance from the coder (2), comprising at least three sensitive elements, at least two of which are positioned opposite the main track (2a) so as to deliver two periodic electrical signals S1, S2 in quadrature and at least one of which is positioned opposite the revolution pip track (2b) so as to deliver an electrical signal S3, the sensor (3) comprising an electronic circuit able, from the signals S1, S2 and S3, to deliver two square digital position signals (A, B) in quadrature which represent the angular position of the rotor (1) and a revolution pip signal (C) in the form of N*M pulses per revolution of the coder (2), the M singularities (2b1) being angularly distributed so that the revolution pip signal (C) is arranged so as, in combination with the signals A and B, to define the binary sequences of angular length less than that of a sector (2c) and which represent the absolute angular position of the coder (2) on a sector (2c);

a circuit for switching the currents in the phase windings of the motor which comprises 2*P*N switches;

a circuit for controlling the switching circuit which is able:

when a binary sequence is read, to determine the state of the switching logic of the currents in the phase windings which corresponds to the absolute angular position associated with the said binary sequence;

according to the position signals (A, B) detected, to determine continuously the state of the switching logic which is adapted to the angular position of the rotor (1);

to supply the switching signals for the switches which correspond to the state of the logic determined by the revolution pip signal (C) or by the position signals (A, B), said motor further comprising a rotor (1) and a fixed piece (8), in which the coder (2) is associated with the rotor (1) and the sensor (3) is associated with the fixed piece (8) of the motor;

said method comprising the following successive steps:

applying a torque to the rotor (1) so as to allow its rotation and therefore that of the coder (2);

detecting the first binary sequence;

determining the state of the switching logic corresponding to the absolute angular position associated with the said binary sequence;

sending to the switching circuit switching signals corresponding to the state determined;

iteratively determining of the subsequent states of the switching logic from the position signals (A, B);

sending to the switching circuit the switching signals corresponding to the states determined.

14. A method according to one of claims 11, 12 or 13, characterised in that it comprises a prior step of angular indexing of the revolution pip pulses with respect to the zeroing of the electromotive forces in the phases of the motor.

* * * * *